United States Patent [19]

Coy et al.

[11] Patent Number: 4,874,970
[45] Date of Patent: Oct. 17, 1989

[54] ECL OUTPUT WITH DARLINGTON OR COMMON COLLECTOR-COMMON EMITTER DRIVE

[75] Inventors: Bruce H. Coy; Raymond C. Yuen, both of San Diego, Calif.

[73] Assignee: Applied Micro Circuits Corporation, San Diego, Calif.

[21] Appl. No.: 193,261

[22] Filed: May 11, 1988

[51] Int. Cl.[4] .................. H03K 19/092; H03K 19/086
[52] U.S. Cl. .................................. 307/475; 307/455; 307/270; 307/246; 307/315
[58] Field of Search ............... 307/455, 270, 475, 246, 307/300, 315

[56] References Cited

U.S. PATENT DOCUMENTS

| | | | |
|---|---|---|---|
| 3,126,490 | 3/1964 | Stern | 307/88.5 |
| 3,999,080 | 12/1976 | Weathersby, Jr. et al. | 307/203 |
| 4,002,931 | 1/1977 | Tsang et al. | 307/264 |
| 4,356,409 | 10/1982 | Masuda et al. | 307/455 |
| 4,356,414 | 10/1982 | Guntner et al. | 307/455 |
| 4,408,134 | 10/1983 | Allen | 307/471 |
| 4,476,403 | 10/1984 | Allen | 307/475 |
| 4,551,638 | 11/1985 | Varadarajan | 307/455 |
| 4,559,458 | 12/1985 | Ma | 307/455 |
| 4,578,942 | 7/1987 | Kanai et al. | 307/455 |
| 4,599,521 | 7/1986 | Kanai et al. | 307/455 |
| 4,628,216 | 12/1986 | Mazumder | 307/455 |
| 4,680,480 | 7/1987 | Hopta | 307/270 |
| 4,680,486 | 8/1987 | Price et al. | 307/475 |

OTHER PUBLICATIONS

Microelectronics, by Jacob Millman and Arvin Grabel, pp. 432–435, 1987.
Integrated Electronics: Analog and Digital Circuits and Systems, by Jacob Millman, Ph.D, and Christos C. Halkias, Ph.D., 1972, pp. 274–279.

Primary Examiner—Stanley D. Miller
Assistant Examiner—Richard Roseen
Attorney, Agent, or Firm—Baker, Maxham, Jester & Meador

[57] ABSTRACT

The described embodiment of the present invention provides an output drive circuit having an input circuit comprising a differentially coupled pair of transistors. The output of the differentially paired transistors is provided to a pair of output driver transistors connected in a Darlington or a common collector-common emitter configuration which provides an output pull up signal to an output pin of the integrated circuit containing the described output driver. The opposite output of the differentially coupled pair is provided to a circuit which provides a pull down pulse to quickly shut off the transistor pair during the high to low transition of the output driver transistor. The use of the output driver transistor driver minimizes the current required by the differential pair and the fast pull down circuit eliminates the speed disadvantage of using a transistor pair output driver.

9 Claims, 2 Drawing Sheets

ECL OUTPUT WITH DARLINGTON OR COMMON COLLECTOR-COMMON EMITTER DRIVE

FIELD OF THE INVENTION

The present invention relates to the field of integrated circuits. More specifically, the present invention relates to the field of output drivers for integrated circuitry.

BACKGROUND OF THE INVENTION

The design of output drivers in integrated circuitry is often a compromise between speed, power consumption and current drive capability. Improvements in one of these areas often cause degradation in another. For example, an increase in drive current causes slower operation of the driver due to the longer discharge time necessary to pull the current from the base of a bipolar transistor or the charge from the gate of a field effect transistor. In addition, the increased current often must pass through internal resistors which increase power consumption of the integrated circuit. For example, FIG. 1 is a schematic diagram of a standard emitter coupled logic (ECL) output driver. The input signal is applied to the base of transistor 1 which is differentially coupled to transistor 2. The base of transistor 2 is tied to a threshold voltage which is equal to the median between the logical high voltage and logical low voltage of the digital circuit. The logical high voltage is generally on the order of $-0.8$ volts and the logical low voltage level is generally on the order of $-1.3$ volts in typical ECL circuitry. Transistor 4 and resistor 5 provide a current source for differential transistors 1 and 2. When the input signal to the base of transistor 1 is higher than $V_T$, the current provided by transistor 4 and resistor 5 flows through transistor 1 and the voltage drop across resistor 3 is the base current of transistor 6 multiplied by the resistance of resistor 3. This pulls the base of transistor 6 high to provide a logical high output signal across resistor 7 and capacitor 8, which are connected via output pin 9 to output buffer 10. A small amount of current through the base of transistor 6 will cause a small voltage drop across resistor 3. When a logical low is provided at the base of transistor 1, transistor 1 turns off and the current provided by transistor 4 and resistor 5 flows through transistor 2 and resistor 3. This current causes a voltage drop across resistor 3. Output pin 9 is then pulled to a low output voltage.

Output driver 10 is limited in its operation by the need to provide the drive current for transistor 6 through resistor 3. Resistor 7 and capacitor 8 are standard pull down devices for ECL circuitry. Assuming a pull down voltage of $-2.2$ volts, a logical high voltage on output pin 9 must be at least $-1$ volt to meet minimum logic definition standards. Thus a voltage drop of 1.2 volts is available across resistor 7. To provide maximum drive current and thus maximum speed, output drive current must be maximized. The maximum drive current through resistor 7, which has a value of 25 ohms, is 1.2 volts divided by 25 ohms or 48 milliamperes. Assuming a typical beta ($B_F$) of 50 at 0 degrees Centigrade for transistor 6, the base current of transistor 6 equals:

$$I_{B6} = \frac{I_{E6}}{1 + B_F} = \frac{48 \text{ mA}}{51} = 941 \text{ }\mu\text{A}$$

where $I_{E6}$ is the emitter current of transistor 6, and $I_{B6}$ is the base current of transistor 6.

$I_{B6}$ passes through resistor 3 which cause a voltage drop $V_{R3}$. Summing the voltages from ground to output pin 9 yields the equation:

O (ground, assuming no bus drop)—where $V_{BE6}$ is the base to emitter drop of transistor 6 and $-1.0$ is the voltage at output pin 9.

Solving for $V_{R3} = 1 - 0.860 = 140$ mV. The R3 maximum R3 is thus $V_{R3}/I_{B6} = 140$ mV/941 $\mu$A = 148.7 ohms.

A typical voltage swing at the collector of transistor 2 is approximately 930 millivolts. This gives a minimum collector current of 930 millivolts divided by 148.7 ohms or 6.25 milliamps. For a large array of more than 100 outputs, this switching current would cause a power of 6.25 milliamps $\times$ 5.7 volts $\times$ 100 gates which is equal to approximately 3.56 watts of power dissipation. This is a great deal of power to be dissipated on a single integrated circuit and necessitates expensive cooling measures such as air flow fins, forced air cooling, and water jacket cooling.

SUMMARY OF THE INVENTION

The described embodiment of the present invention provides an output drive circuit utilizing a Darlington Output Driver or common collector common emitter configuration. The high gain of the output drive circuit minimizes the current required through the differential input elements of the output driver. The slow turn off speed for the output drive circuit is mitigated by a fast pull down circuit which pulls base drive current from the output transistor away. Thus, the described embodiment provides high output drive while minimizing the power dissipated internally in the integrated circuit. In the described embodiment, speed and output drive are further enhanced by the use of a positive 5 volt power supply which is commonly used in ECL type integrated circuits to allow for TTL compatibility. Because the output pull up circuitry in the output driver coupled with the internal pull down circuitry is provided, traditional output conditioning by external components may be eliminated and direct ECL output drive to a transmission line may be provided. This eliminates the need for external components, thus saving manufacturing time and cost.

DETAILED DESCRIPTION

Figure 2:
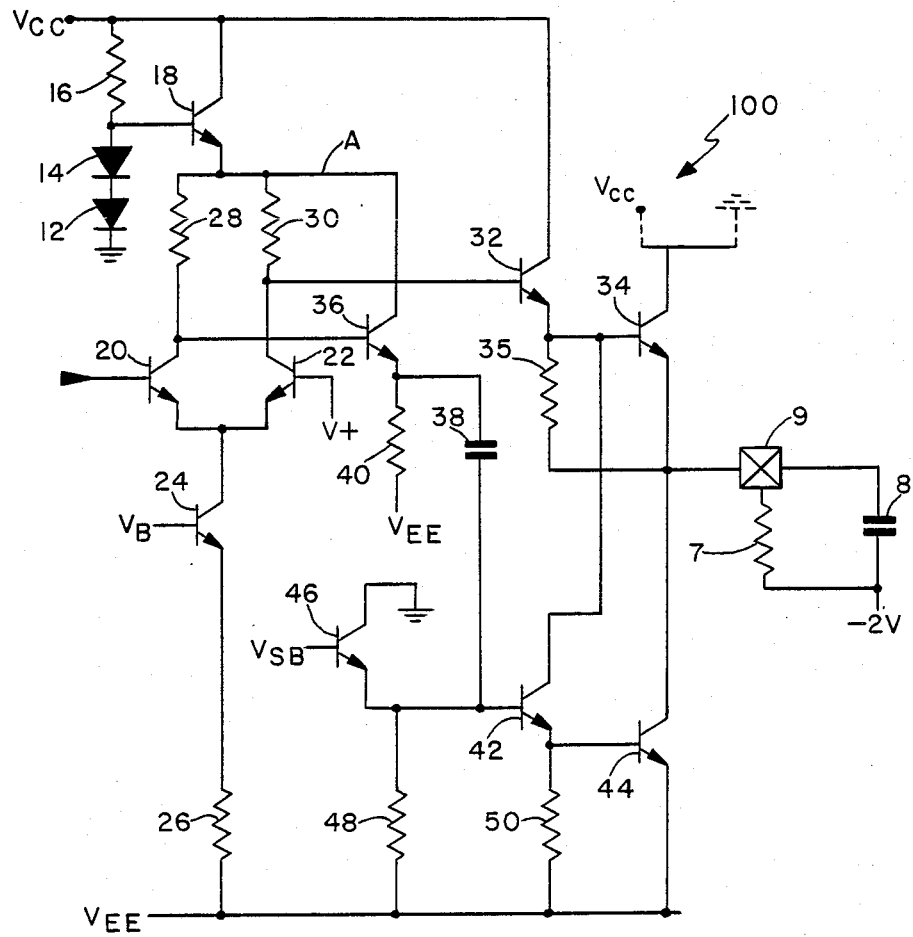
FIG. 2 is a schematic diagram depicting one embodiment of the present invention.

FIG. 2 is a schematic diagram depicting one embodiment of the present invention. Output driver 100 is designed to be operated with 3 voltage levels supplied. The first level is VCC which is approximately +5 volts. The second level is ground which is approximately 0 volts. The third level is VEE which is approximately $-5.7$ volts. These voltages are commonly applied in ECL logic circuits to allow for compatibility with TTL output circuitry in certain instances. Diodes 12 and 14, resistor 16 and transistor 18 are voltage regulation circuitry for regulating the voltage supplied to node A. Current is driven from VCC through resistor 16 through diodes 14 and 12 to ground. A voltage drop of approximately of 1.72 volts or 2 VBE is developed across diodes 12 and 14. This voltage level clamps the emitter of transistor 18 to 2 VBE −VBE or 0.86 volts.

Figure 1:
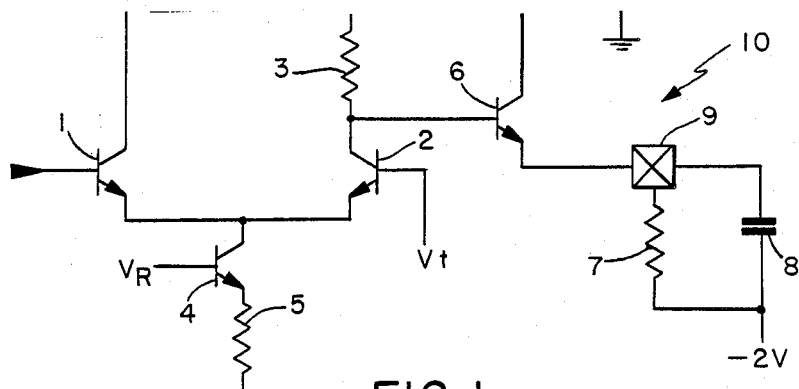
FIG. 1 is a schematic diagram showing a standard prior art output circuit.

The input signal to output driver 100 is provided to the base of transistor 20 which is differentially coupled to transistor 22. Transistor 24 and resistor 26 provide current to differential transistors 20 and 22. VB and the value of resistor 26 are chosen to supply the appropriate current for generating the necessary voltage drops across resistors 28 and 30. The voltage level on the collector of transistor 22 drives the base of transistor 32 which is coupled in Darlington pair fashion with transistor 34. In this regard, the collectors of the transistors 32 and 34 are connected in common to $V_{CC}$. Alternatively, the collector of transistor 34 can be connected to ground potential, in which case the transistor 32 and 34 will be connected in a common collector-common emitter configuration. These alternate configurations are illustrated in FIG. 2 by connection of symbols for VCC and GMND to the transistor 34. Resistor 35 provides increased bias for transistor 32. To provide the appropriate drive for a 50 ohm transmission line (resistor 7, capacitor 8 and output pin 9 are exactly the same components as shown in FIG. 1 and are thus similarly labeled), current through resistor 30 must drive not only transistor 32 but transistor 34. Thus, with a voltage drop across resistor 7 of 1.2 volts, a VBE cross transistor 34 of 860 millivolts, the voltage level at the base of transistor 32 must be 1 VBE greater than the voltage level at the base of transistor 6 of FIG. 1. However, node A is held at a voltage level 1 VBE above ground, thus the required voltage drop across resistor 30 is the same as the required voltage drop across resistor 3 of FIG. 1. However, because of the high gain of the transistors 32 and 34, a much lower base drive current is required to generate the appropriate drive current through resistor 7. If, for example, the gain of transistors 32 and 34 is three times that of transistor 6 of FIG. 1 (a modest figure), the power driven through differential pair 20 and 22 is reduced by ⅓.

Transistor 22 is off when a logical high input signal is applied to the base of transistor 20. When transistor 22 is off, resistor 30 pulls up the base of transistor 32. Conversely, when a logical 0 is applied to the base of transistor 20, current is drawn through transistor 30, for a logic low output signal on pin 9. However, because of the large drive currents and internal capacitance of transistors 32 and 34, a Darlington pair is substantially slower than a single transistor. To maintain the speed of the output driver, a method for quickly discharging transistors 32 and 34 is required.

The circuitry which accomplishes this goal is triggered when transistor 20 is shut off and the collector of transistor 20 is pulled high through resistor 28. This pulls the base of transistor 36 up to the voltage of node A. When the base of transistor 36 was low, the upper plate of capacitor 38 was charged to approximately ground potential through transistor 36. When the base of transistor 36 is high, a positive pulse goes through capacitor 38 to turn on transistor 42 which pulls drive current from the base of transistor 34 and also turns on transistor 44 which quickly pulls output pin 9 low. Transistor 46 is biased at its base by VSB which is set at just below 3 VBE. Thus when transistors 42, 44, and 46 are in their quiescent state, the base of transistor 42 is pulled to just below 2 VBE through resistor 48 and the base of transistor 44 is pulled to just below VBE through resistor 50. However, while transistors 42 and 44 were on, transistors 32 and 34 were quickly turned off. The high drive current of these transistors coupled with the discharging action of transistors, 42 and 44, provides turn off and turn on times comparable to those provided by output driver 10 of FIG. 1.

Figure 3:
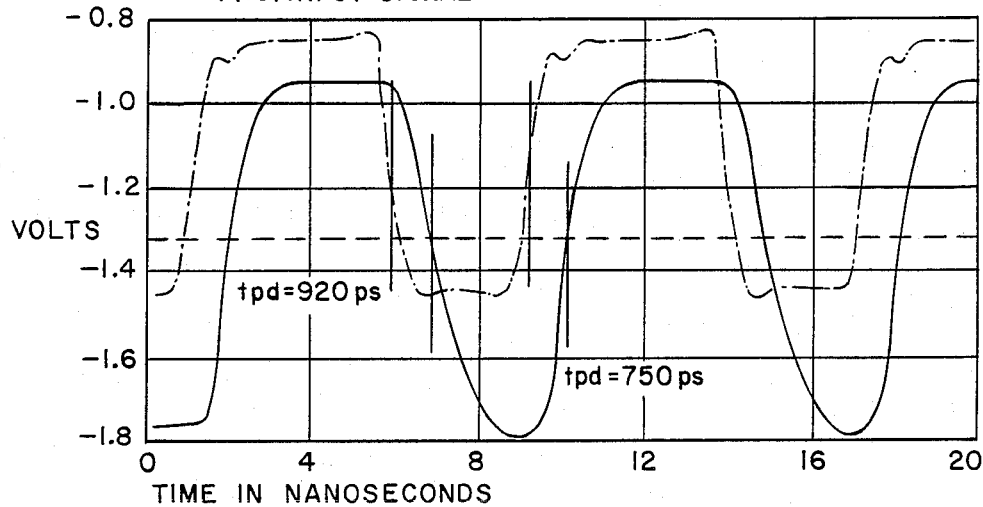
FIG. 3 and 4 are timing graphs comparing the output drive capabilities and delay time of the output driver of FIG. 1 to the output driver of FIG. 2.
Figure 4:
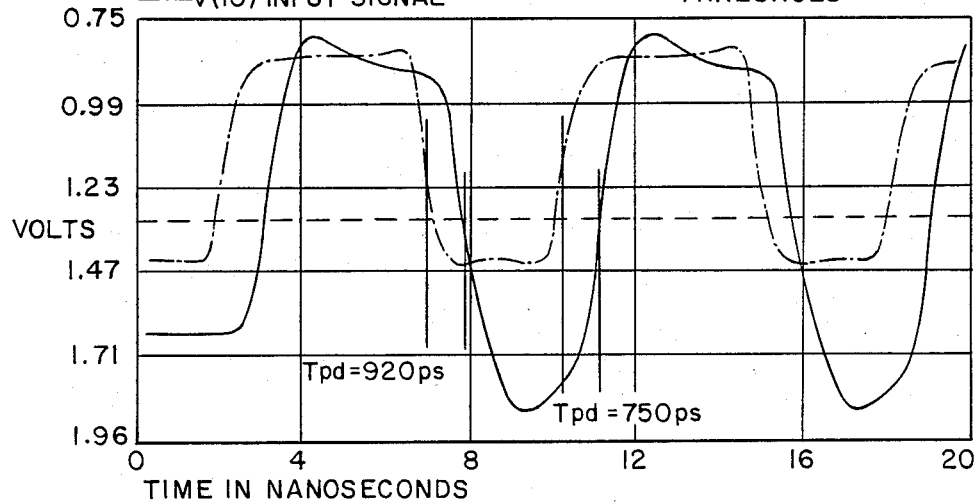

FIGS. 3 and 4 are graphs comparing the rise and fall times of the input and output signals of output driver 10 and output driver 100 respectively. These graphs show that the rise and fall time of the two drivers are nearly identical. However, because of the reduced current through differential pair 20 and 22, power consumption is dramatically reduced in driver 100. The power consumed by differential pair 20 and 22 is approximately 13 milliwatts maximum. The power consumed by transistor 36 and pull down circuitry is equal to 7½ milliwatts. The additional drive current consumed by transistor 32 is approximately 4 milliwatts. The sum of this 24½ milliwatts which provides a power savings of approximately 35% over the 38 milliwatt power consumption of output driver 10 of FIG. 1.

Although a specific embodiment of the present invention is described in the specification, it is not to be construed as limiting the scope of the invention. Several modifications of the present invention will become clear to those skilled in the art in light of the teachings of the specifications. For example, junction field effect transistor will provide many functions similar to those of bipolar transistors and an embodiment of this invention containing field effect transistors may be possible. The scope of the present invention is limited only by the claims appended hereto.

We claim:

1. An output driver comprising:
   a differential pair of transistors having a first input terminal connected to a buffer input terminal, a second input terminal connected to a first reference potential, a first output terminal for providing a first output signal, and a second output terminal for providing a second output signal logically opposite to said first output signal provided on said first output terminal;
   a Darlington pair of transistors having an input terminal connected to said first output terminal of said differential pair of transistors, having an output terminal connected to an output buffer output terminal, and having an intermediate terminal connected to the emitter of the first transistor of said Darlington pair of transistors;
   a first transistor having a first current handling terminal connected to a positive potential, having a control terminal connected to said second output terminal of said differential pair of transistors and having a second current handling terminal;
   a first resistor having a first terminal connected to said second current handling terminal of said first transistor and having a second terminal connected to a circuit potential;
   a capacitor having a first plate connected to said second current handling terminal of said first transistor and having a second plate;
   a second transistor having a first current handling terminal connected to said intermediate terminal of said Darlington pair, having a control terminal connected to said second plate of said capacitor and having a second current handling terminal connected to said circuit potential; and a third transistor having a first current handling terminal connected to said output terminal of said Darlington pair, having a second current handling terminal connected to said circuit potential and having a control terminal connected to said second current handling terminal of said second transistor.

2. An output driver according to claim 1 wherein said transistors comprise bipolar transistors.

3. An output driver according to claim 1 further comprising a second resistor having a first terminal connected to said control terminal of said second transistor and having a second terminal connected to said circuit potential.

4. An output driver according to claim 1 further comprising a third resistor having a first terminal connected to said control terminal of said third transistor and having a second terminal connected to said circuit potential.

5. An output driver comprising:
a first transistor having a base connected to an output driver input terminal, having a collector and having an emitter;
a first resistor having a first terminal connected to said collector of said first transistor and having a second terminal;
a second transistor having an emitter connected to said emitter of said first transistor, having a base connected to a first bias potential and having a collector;
a second resistor having a first terminal connected to said collector of said second transistor and having a second terminal connected to said second terminal of said first resistor;
a third transistor having a collector connected to said emitter of said first transistor, having a base connected to a second bias potential and having an emitter;
a third resistor having a first terminal connected to said emitter of said third transistor and having a second terminal connected to a negative potential;
a fourth transistor having a base, having a collector connected to a positive potential and having an emitter connected to said second terminal of said first resistor;
a fourth resistor having a first terminal connected to said positive potential and having a second terminal connected to said base of said fourth transistor;
a first diode having an anode connected to said base of said fourth transistor and having a cathode;
a second diode having an anode connected to said cathode of said first diode and having a cathode connected to a ground potential;
a fifth transistor having a base connected to the collector of said second transistor, a collector connected to the collector of said fourth transistor and having an emitter;
a sixth transistor having a base connected to said emitter of said fifth transistor, having a collector connected to said ground potential and an emitter connected to an output terminal;
a seventh transistor having a base connected to said collector of said first transistor, having a collector connected to said emitter of said fourth transistor and having an emitter;
a fifth resistor having a first terminal connected to said emitter of said seventh transistor and having a second terminal connected to said negative potential;
a capacitor having a first plate connected to said emitter of said seventh transistor and having a second plate;
an eighth transistor having a collector connected to said ground potential, having a base connected to a third bias potential and having an emitter connected to said second plate of said capacitor;
a sixth resistor having a first terminal connected to said emitter of said eighth transistor and having a second terminal connected to said negative potential;
a ninth transistor having a base connected to said second plate of said capacitor, having a collector connected to said base of said sixth transistor and having an emitter;
a seventh resistor having a first terminal connected to said emitter of said ninth transistor and having a second terminal connected to said negative potential; and
a tenth transistor having a base connected to said emitter of said ninth transistor, having a collector connected to said output terminal of said output buffer and having an emitter connected to said negative potential.

6. In a circuit for converting a first logic signal, where said first logic signal is provided from a differentially-operated circuit in complementary form, said first logic signal including a first differential signal having a first characteristic provided at a first node of said circuit, and a second differential signal having a second characteristic, complementary to said first characteristic, provided at a second node of said circuit, an improved output circuit for providing an output logic signal at a circuit output node, said output circuit comprising:
an emitter follower having an input terminal connected to said first node and an output terminal for providing a drive signal in response to said first differential signal;
an output transistor having a base connected to said emitter follower output terminal, a collector for being connected to a first circuit potential, and an emitter connected to said circuit output node, said output transistor conducting current at said output node in response to said drive signal; and
capacitative discharge means connected to said second node, to said base, and to said output node for conducting current to discharge said emitter follower, said output transistor, and said output node in response to said second differential signal.

7. The output circuit of claim 6, wherein said emitter follower and said output transistor are connected in a Darlington configuration.

8. The output circuit of claim 6, wherein said emitter follower and said output transistor are connected in a common collector-common emitter configuration.

9. The output circuit of claim 6, wherein said capacitative discharge means includes a capacitor connected to said second node, and transistor circuit means connected to said capacitor, to said base, and to said output node for conducting discharge current at said base and discharge current at said output node in response to a polarity transition in said second differential signal.

* * * * *